United States Patent [19]
Stevenson

[11] Patent Number: 5,255,326
[45] Date of Patent: Oct. 19, 1993

[54] INTERACTIVE AUDIO CONTROL SYSTEM

[76] Inventor: Alden Stevenson, 3994 Belair Rd., Augusta, Ga. 30909

[21] Appl. No.: 884,012

[22] Filed: May 18, 1992

[51] Int. Cl.$^5$ .............................................. H03G 3/20
[52] U.S. Cl. .................................................. 381/110
[58] Field of Search .................. 340/555; 381/59, 103, 381/25, 1, 110, 28

[56] References Cited

U.S. PATENT DOCUMENTS

| | | |
|---|---|---|
| 2,392,218 | 1/1946 | Anderson . |
| 4,485,484 | 11/1984 | Flanagan . |
| 4,506,377 | 3/1985 | Kishi . |
| 4,558,459 | 12/1985 | Noso . |
| 4,659,919 | 4/1987 | Price ........................... 340/555 |
| 4,659,922 | 4/1987 | Duncan ....................... 340/555 |
| 4,712,247 | 12/1987 | Swarte ........................ 381/59 |
| 4,823,391 | 4/1989 | Schwartz .................... 381/103 |
| 4,831,448 | 5/1989 | Park ............................ 340/555 |
| 4,845,751 | 7/1989 | Schwab ...................... 381/25 |
| 4,856,072 | 8/1989 | Schneider . |

Primary Examiner—Forester W. Isen
Attorney, Agent, or Firm—LaValle D. Ptak

[57] ABSTRACT

An interactive audio system employs a sound signal processor coupled with a microprocessor as an interactive audio control system. A pair of tranceivers, operated as stereophonic loudspeakers and also as receiving microphones, are coupled with the signal processor for receiving voice commands from a principal user. The voice commands are processed to operate a variety of different devices, such as television, tape, radio or CD player for supplying signals to the processor, from which signals then are supplied to the loudspeakers of the transceivers to produce the desired sound. Additional infrared sensors may be utilized to constantly triangulate the position of the principal listener to supply signals back through the transceiver system to the processor for constantly adjusting the balance of the sound to maintain the "sweet spot" of the sound focused on the principal listener. Additional devices also may be controlled by the signal processor in response to voice commands which are matched with stored commands to produce an output from the signal processor to operate these other devices in accordance with the spoken voice commands. The system is capable of responding to voice commands simultaneously with the reproduction of stereophonic sound from any one of the sources of sound which are operated by the system.

15 Claims, 1 Drawing Sheet

INTERACTIVE AUDIO CONTROL SYSTEM

BACKGROUND

High fidelity stereophonic sound reproduction systems for home use are becoming increasingly sophisticated. Such systems are used for music reproduction, television sound reception, and the playback of video recordings. The goal of ideal stereo reproduction is to provide a realistic illusion to the listener that the listener is in the actual concert hall or other environment depicted by the sound. To accomplish this effect of essentially a three-dimensional sound, techniques which are known as "surround sound" have been developed. These techniques utilize additional speakers at the rear of the room to supply delayed sound (comparable to symphone hall reflections) to place the delayed sound in the air around the listener. The effect is that the lestener is in the same body of air as the performers, or, essentially, that of actually being in the concert hall. This is contrasted with a simple two speaker stereo system, in which all of the sound is directed to the listener from the same frontal direction as the direct sound produced by the orchestra, singer, or other musicians.

Various techniques are employed to produce "surround sound" effects in theaters and in home music systems. Even with sophisticated systems, however, there is an ideal position or "sweet spot" in the room where the balance of the left and right stereophonic sounds is directed. If the primary listener moves to some other spot in the room, it is necessary to manually adjust the balance of the left and right speakers to move the "sweet spot" to the desired position.

The patent to Anderson U.S. Pat. No. 2,392,218 is directed to a specific system for automatically compensating for variations in background noise in the room in which an audio system is being operated. In the system of Anderson, a microphone and a speaker are mounted in the same housing. The microphone is separate from the speaker, and is present for the purpose of detecting background noise in the room, and supplying a signal to adjust the output level of the speakers accordingly. The speaker level is adjusted upwardly when the level of loud background noise increases; and it is adjusted downwardly when background noise is at a minimum. The microphones and speakers in this system are totally separate components.

Systems also have been developed for receiving multiple inputs from different locations in a large room, and combining those inputs together for a signal which is reproduced over a loudspeaker. Such a system is disclosed in the Flanagan U. S. Pat. No. 4,485,484. In this system, microphones are directed to receive signals from a particular segment or location in a large room for reproduction over the loudspeaker system.

Other systems have been developed for operating various devices, such as switches, computers and the like, from spoken commands. Three patents disclosing such systems are the patents to Kishi U.S. Pat. No. 4,506,377; Noso U.S. Pat. No. 4,558,489; and Schneider U.S. Pat. No. 4,856,072. These patents all disclose systems which respond to voice or spoken instructions to operate switches of various types. Computer systems have been developed for storing a vocabulary of voiced synthesized sounds from a particular operator; so that the computer recognizes speech from that operator, and effects the desired control established by the program in the computer. For example, some limited development has taken place for utilization of such a system in a simple word processor, where the user simply speaks the material to be reproduced to the computer along with suitable commands, to produce a printed copy of the spoken dictation.

It is desirable to provide an interactive audio control system, which is capable of steering or moving the sweet spot of the reproduced sound, and further, which employs transceivers for both reproducing sound from the system and for receiving commands for effecting various operations through the system, both directly related to control of the system and to control of other functions through the system.

SUMMARY OF THE INVENTION

It is an object of this invention to provide an improved interactive audio control system.

It is another object of this invention to provide an improved interactive audio control system utilizing transceivers both for reproducing sound and for receiving sound and processing the received sounds independently of the reproduced sound.

It is an additional object of this invention to provide an improved interactive audio system which is capable of tracking a principal listener and balancing the reproduced sound in accordance with the position of the principal listener.

It is a further object of this invention to provide a improved interactive audio system, in which the system loudspeakers also function as microphones to return signals to a signal processing unit for effecting a variety of responses or operations in response to spoken or other sound commands within the range or the speaker/microphones.

In accordance with a preferred embodiment of the invention, an interactive audio control system includes a signal processor for supplying and receiving signals to be processed. First and second transceivers are coupled with the signal processor for reproducing sound signals received from the signal processor. Similarly, these transceivers are used to supply control signals to the signal processor. In one embodiment, a device is coupled with the transceivers for producing control signals supplied to the signal processor to automatically change the balance of sound signals produced by the first and second transceivers in response to a predetermined external parameter.

DETAILED DESCRIPTION

Figure 1:
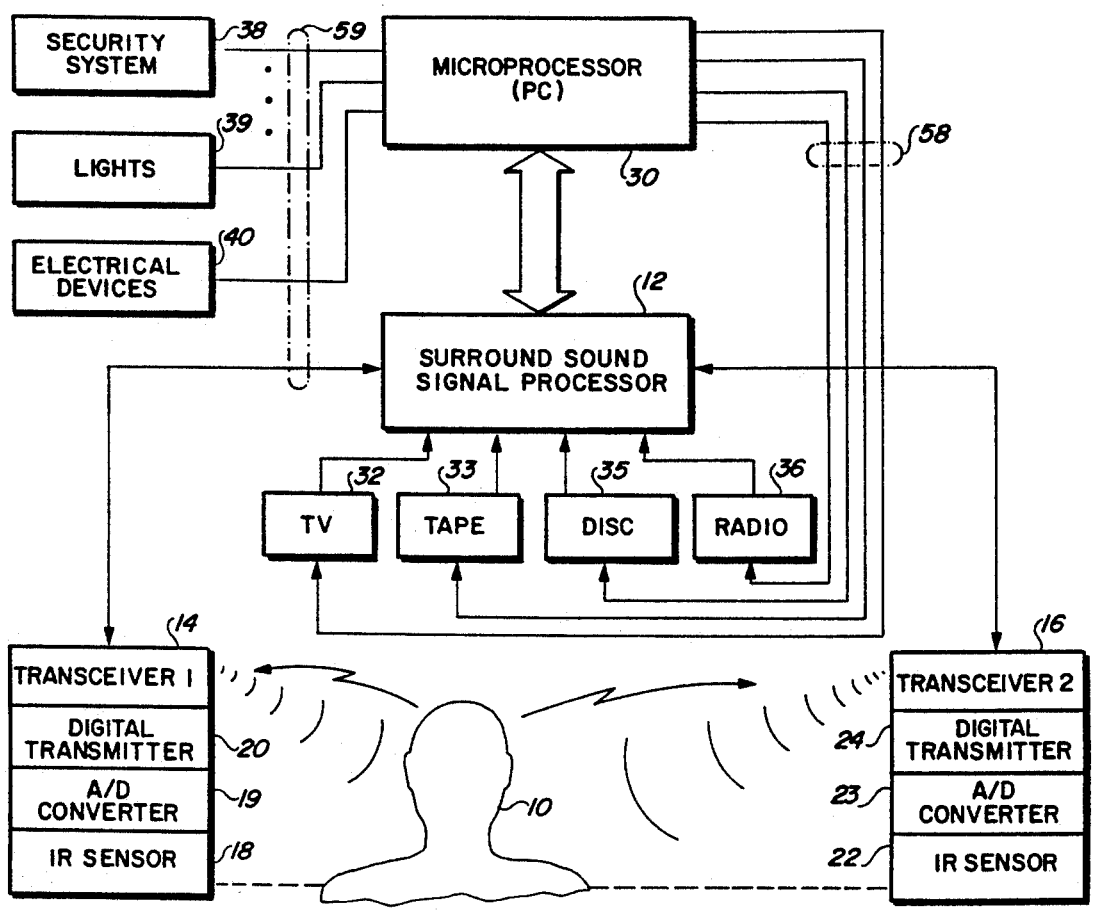
FIG. 1 is a block diagram of a preferred embodiment of the invention.
Figure 2:
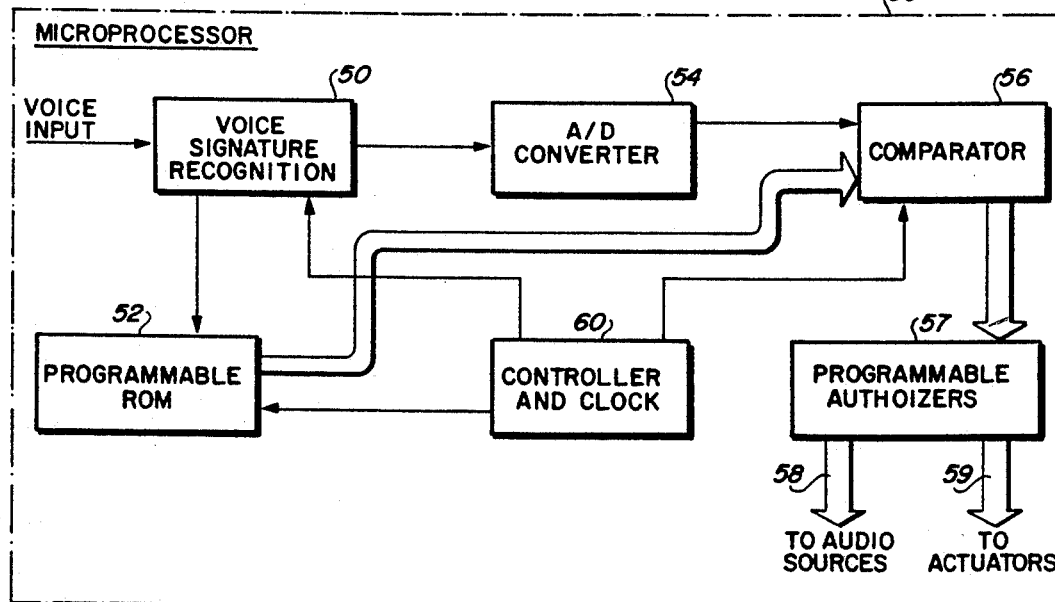
FIG. 2 is a detailed block diagram of a portion of the system shown in FIG. 1.

Reference now should be made to the drawing, in which the same reference numbers are used in both FIGS. 1 and 2 to designate the same components. FIG. 1 illustrates the system. The system is shown in conjunction with a principal listener/command source 10, which typically is a person located in the room in which the system is placed.

The heart of the system includes a surround sound signal processor 12, which, basically, may be one of any number or conventional systems for producing surround sound signals Typically, the surround sound signal processor 12 supplies audio signals outwardly to stereophonic speakers located at spaced positions within the room. In place of standard stereophonic speakers, however, the surround signal processor 12 of FIG. 1 is shown coupled to a pair of transceivers 14 and 16. The transceivers 14 and 16 comprise stereophonic speaker units, each comprising multiple speakers or a single speaker, as desired. The speakers in these units, however, also are utilized as feedback microphones to supply sound signals from the transceivers 14 and 16 back to the surround sound signal processor 12, which is further coupled with a microprocessor or personal computer 30 for receiving signals from and supplying signals to the surround sound signal processor 12.

Whenever sound signals are being reproduced and amplified by the signal processor 12 from any one of a number of different sources, such as a television set 32, tape deck 33, compact disc player 35, or a radio 36, those signals are supplied to the speakers of the transceivers 14 and 16 for conventional reproduction. As with any stereophonic system, the level or balance of the sounds produced in each of the two or more channels is adjusted by a "balance" control (not shown). If the principal listener 10, however, moves to a position which is off-center or not at the point where the balance originally has been set, it typically is necessary to manually re-adjust the balance in order to produce the most desirable sound at the listening position where the principal listener 10 is located.

The system illustrated in FIG. 1 additionally employs a pair of infrared sensors 18 and 22. These sensors are coupled, respectively, through analog-to-digital convertors 19 and 23 to digital transmitters 20 and 24 for supplying digitized signals indicative of the triangulation or location of the principal listener 10, back through the transceivers 14 and 16, respectively, to the surround sound signal processor 12. This information is supplied to the microprocessor 30 which then supplies signals back to the surround sound signal processor 12 for automatically adjusting the "balance" of the audio signals to be reproduced by the loudspeakers of the transceivers 14 and 16. The utilization of the infrared sensors 18 and 22 permits the system continually to triangulate on the principal listener 10 and, essentially, report the position of the principal listener 10 in the room to effect automatic adjustment of the balance of the speakers to the desired level initially set by the principal listener 10 for some initial starting position when the system first is turned on.

In addition to the infrared feedback signals for locating the principal listener 10, additional information from the principal listener 10 can be supplied back from the transceivers 14 and 16 to the surround sound signal processor 12. For example, by utilizing analog-to-digital conversion of the audio signals produced from each channel and subtracting this information from the digital feedback produced by sounds within the range of the transceivers 14 and 16, the system easily can receive and process audio or voice commands from the principal listener 10. For example, commands such as "volume up", "volume down", "change to TV, disc, tape etc."; "channel up" (for TV); "set room thermostat two degrees higher"; and many other commands can be processed. By means of voice recognition circuitry in the microprocessor 30 these commands can be limited to a select person or a select few people.

In addition, if desired, the redundant information from a spoken command permits the system to utilize spoken commands for triangulation of location of the principal listener 10 as the g principal listener speaks. Such a "voice" triangulation to adjust the spoken sound balance may be used in addition to the infrared triangulation, or in place of it, if silent tracking or triangulation of the music reproduced by the system is not desired.

In response to some of the spoken commands, changes of the input to the signal surround sound processor 12 is effected. The commands are processed by the microprocessor 30 to turn on or off the desired audio input sources, which are typified by the television 32, tape deck 33, compact disc player 35, and radio 36, as shown controlled by individual control wires 58 from the microprocessor 30 in FIG. 1. Commands which affect the sound level, balance, television channel change and the like are processed, either directly in the sound signal processor 12 or in the microprocessor 30, with signals sent back to the sound processor 12 to effect the desired control of the audio output from the sound signal processor 12.

Additional commands, mentioned above to control systems or switches outside of the stereo/audio system, also may be effected through the system. Spoken commands, which are recognized by voice signature recognition circuitry in the microprocessor 30, may be used to arm and disarm a security system 38, turn on and turn off lights 39, and other electrical devices 40, for example. The number of different items which can be controlled is limited only by the imagination of the designer of the system.

For example, consider a typical scenario. The principal listener 10 awakens in the night, and is unable to go back to sleep. The principal listener 10 moves within the range of the transceivers 14 and 16, or either of them, and speaks a computer-recognizable command, recognized by the microprocessor 30 after reception by the microphone portion of the transceiver 14 to turn the stair lights on. This is done, and lights, such as the lights 39, are turned on. The person then moves to a favorite location and notices that the room is somewhat chilly. A spoken command is given to raise the thermostat temperature by two degrees fahrenheit. Once again, the microprocessor 30 recognizes the spoken command and sends a control signal by way of one of a plurality of the leads 59 to the thermostat to effect this operation. Next, a request may be made to turn on some music derived from the compact disc player 35, for example, with further commands as to the start of a pre-loaded disc. All of these voice commands are processed by the microprocessor 30, and then supplied to the surround sound signal processor 12 for operation to reproduce the desired sound in the loudspeakers of the transceivers 14 and 16. This type of activity can be continuously effected, with both the reproduction of audio sound signals by the transceivers 14 and 16 taking place with simultaneous sound commands from the principal listener 10 supplied back through the system to the microprocessor 30 for further processing.

FIG. 2 is a detailed block diagram of the functional operation of the microprocessor 30. As is shown in FIG. 2, the voice input signals are first supplied to a voice signature recognition circuit 50. In the initial operation of the system, various voice commands which are to be recognized are made and are stored in a programmable ROM 52, which has appropriate look-up tables for subsequent utilization by the microprocessor system to recognize and operate in response to voice input signals.

Now assume the programmable ROM 52 is fully loaded with a look-up table for the various commands which are capable of being processed by the system. Upon the receipt of any new voice input signals, the voice signature recognition circuit 50 receives that signal, and supplies it to an analog-to-digital converter 54 where the signal is digitized.

The digitized version of the signal 54 then is compared by rapidly scanning that signal against the look-up table of signal patterns which are stored in the programmable ROM 52. If a match is made by the comparator 56 with any one of the stored voice signal patterns, an output is supplied from the comparator 56 to programmable authorizer 57, which supply appropriate output signals on one lead of one or the other of two bundles of multiple output leads identified as 58 and 59 in FIG. 2 The same leads 58 and leads 58 are used to control the various audio input devices which supply sound signals to the surround sound signal processor 12. The leads 59 are shown as used to operate various switches, such as a security system 38, lights 39 and electrical devices 40, which have been discussed above.

To synchronize all of the operation of the various circuit elements of the microprocessor shown in FIG. 2, a controller and clock circuit 60 is interconnected with the various circuit elements to cause the desired operation to take place. Upon the receipt of any voice input signal, a scan is made to see if there is a match with the stored pattern. If a match occurs, the comparator 56 provides an output to the programmable authorizer 57, which in turn sends an appropriate control signal over a selected one of the leads 58 and 59 to effect the desired operation corresponding to the spoken voice command.

Since the transceivers 14 and 16 are intended to be "listening" at all times, even when the surround sound signal processor system 12 is turned off, it is desirable to use rechargeable lithium or nickel-cadmium batteries in the transceivers 14 and 16; so that they are continuously powered and ready to receive spoken commands. Recharging of these batteries can be effected automatically whenever the surround sound signal processor 12 is turned on to operate the audio system, or it can be effected automatically through the surround sound signal processor and microprocessor 30 whenever the charge on the batteries drops to some pre-established low level, at which automatic recharging is desired to be effected.

The foregoing description of the preferred embodiment of the invention is to be considered as illustrative, and not as limiting. The applications can be expanded to fit many different situations. Various changes and modifications will occur to those skilled in the art, without departing from the true scope of the invention as defined in the appended claims.

I claim:

1. An interactive audio control system including in combination:
    a signal processor means for supplying and receiving signals to be processed and including voice signature recognition means therein;
    at least first and second transceiver means coupled with said processor means for reproducing sound signals received from said signal processor means and for supplying control signals to said signal processor means in response to spoken voice commands for controlling the sound reproduced by said first and second transceiver means in accordance with processed voice commands; and
    means coupled with said first and second transceiver means for producing control signals supplied to said signal processor means for automatically changing the balance of sound signals reproduced by said first and second transceiver means in response to a predetermined external parameter.

2. The combination according to claim 1 further including a plurality of different sound sources selectively coupled with said signal processor means for supplying signals to said first and second transceiver means.

3. The combination according to claim 2 further including means for selectively coupling said sound sources with said signal processor means.

4. The combination according to claim 3 wherein said means for producing control signals comprises first and second infrared sensors located, respectively, with said first and second transceiver means, each responding to the position of a person located within a predetermined distance from each of said first and second transceiver means for producing said control signals supplied to said signal processor means.

5. The combination according to claim 4 wherein said first and second transceiver means each operate both as a loudspeaker and as a microphone.

6. The combination according to claim 5 further including a plurality of electrically activated devices coupled with said signal processor means for activation thereby in response to different predetermined voice signatures picked up by the microphone of at least one of said first and second transceiver means.

7. The combination according to claim 1 wherein said means for producing control signals comprises first and second infrared sensors located, respectively, with said first and second transceiver means, each responding to the position of a person located within a predetermined distance from each of said first and second transceiver means for producing said control signals supplied to said signal processor means.

8. The combination according to claim 1 wherein said signal processor means includes a voice signature recognition means for responding to different voice speech patterns for comparison with stored patterns to produce different control signals, and further including a plurality of utilization devices responsive to different ones of said control signals for operation thereby.

9. The combination according to claim 8 wherein said signal processor means includes an ROM memory storing a predetermined number of specific voice speech patterns, with voice patterns received by said signal processor means from said transceiver means being compared with said stored voice speech patterns to provide predetermined outputs in response to valid comparisons for producing said different control signals.

10. The combination according to claim 1 wherein a plurality of different audio input devices are coupled with said signal processor means to supply signals thereto for reproduction by said first and second transceiver means.

11. The combination according to claim 1 wherein said first and second transceiver means each operate both as a loudspeaker and as a microphone.

12. The combination according to claim 1 further including a plurality of electrically activated devices coupled with said signal processor means for activation thereby in response to different predetermined voice signatures picked up by the microphone of at least one of said first and second transceiver means.

13. An interactive audio control system including in combination:

a signal processor means for supplying and receiving signals to be processed and including voice signature recognition means therein;

transceiver means coupled with said signal processor means for reproducing sound signals received from said signal processor means and for supplying control signals to said signal processor means in response to spoken voice commands for controlling the sound reproduced by said transceiver means in accordance with processed voice commands;

a device coupled with said signal processor means for operation thereby; and means coupled with said transceiver means for producing control signals supplied to said signal processor means for operating said device in response to a predetermined external parameter.

14. The combination according to claim 13 wherein said transceiver means operates both as a loudspeaker and as a microphone.

15. An interactive audio control system including in combination:

signal processor means for supplying and receiving signals to be processed and including voice signature recognition means therein;

transceiver means operable both as a microphone and a loudspeaker, coupled with said signal processor means for reproducing sound signals received from said signal processor means and for supplying control signals to said signal processor means in response to different predetermined voice signatures picked up by the microphone of said transceiver means; and a plurality of electrically activated devices coupled with said signal processor means for activation thereby in response to said different predetermined voice signatures picked up by the microphone of said transceiver means.

* * * * *